US012610774B2

(12) United States Patent
Won et al.

(10) Patent No.: US 12,610,774 B2
(45) Date of Patent: Apr. 21, 2026

(54) NON-RIGID PAD FOR DEVICE TRANSFER, METHOD FOR MANUFACTURING NON-RIGID PAD FOR DEVICE TRANSFER, AND NON-RIGID PAD GROUP FOR DEVICE TRANSFER COMPRISING NON-RIGID PAD FOR DEVICE TRANSFER

(71) Applicant: CENTER FOR ADVANCED META-MATERIALS, Daejeon (KR)

(72) Inventors: Se Jeong Won, Daejeon (KR); Hak Joo Lee, Daejeon (KR); Jung Yup Kim, Daejeon (KR); Jae Hyun Kim, Daejeon (KR); Yun Hwangbo, Daejeon (KR); Sang Min Kim, Daejeon (KR); Sung Uk Yoon, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 323 days.

(21) Appl. No.: 17/903,019

(22) Filed: Sep. 5, 2022

(65) Prior Publication Data

US 2023/0005766 A1    Jan. 5, 2023

Related U.S. Application Data

(63) Continuation of application No. PCT/KR2021/004559, filed on Apr. 12, 2021.

(30) Foreign Application Priority Data

Apr. 13, 2020 (KR) ........................ 10-2020-0044605
Apr. 8, 2021 (KR) ........................ 10-2021-0045824

(51) Int. Cl.
*H01L 21/67* (2006.01)
*B29C 33/38* (2006.01)
*B33Y 80/00* (2015.01)

(52) U.S. Cl.
CPC .... *H01L 21/67092* (2013.01); *B29C 33/3842* (2013.01); *B33Y 80/00* (2014.12)

(58) Field of Classification Search
CPC .............. H01L 21/67092; B33Y 80/00; B29C 33/3842
See application file for complete search history.

(56) References Cited

U.S. PATENT DOCUMENTS

2018/0204973 A1 * 7/2018 Jeung ................... H10H 20/825

FOREIGN PATENT DOCUMENTS

KR 10-2007-0011901 A 1/2007
KR 10-1104923 B1 1/2012
(Continued)

OTHER PUBLICATIONS

International Search Report for PCT/KR2021/004559 mailed Jul. 19, 2021 from Korean Intellectual Property Office.

*Primary Examiner* — Alicia J Weydemeyer
*Assistant Examiner* — Laura B Figg
(74) *Attorney, Agent, or Firm* — Revolution IP, PLLC

(57) ABSTRACT

Disclosed herein are a non-rigid pad for device transfer, which allows uniform contact pressure to be applied between multiple devices and a target substrate to which the devices are to be transferred, a method of manufacturing the same, and a non-rigid pad group for device transfer including the same. The non-rigid pad includes: a base plate; and multiple pillars each protruding from one surface of the base plate with one end thereof connected to the one surface of the base plate, the pillars being bent and deformed upon application of external force, wherein the non-rigid pad is disposed between a transfer film to which multiple devices to be transferred to a target substrate are adhesively attached and a pressing unit providing pressing force to transfer the multiple devices to the target substrate, the non-rigid pad (Continued)

being bent and deformed upon application of pressing force by the pressing unit to allow uniform contact pressure to be applied between the multiple devices and the target substrate.

14 Claims, 15 Drawing Sheets

(56)                 References Cited

FOREIGN PATENT DOCUMENTS

| | | |
|---|---|---|
| KR | 10-1754528 B1 | 7/2017 |
| KR | 10-2007802 B1 | 8/2019 |
| WO | 2020-040605 A1 | 2/2020 |

* cited by examiner

【FIG. 1】
<u>Prior Art</u>
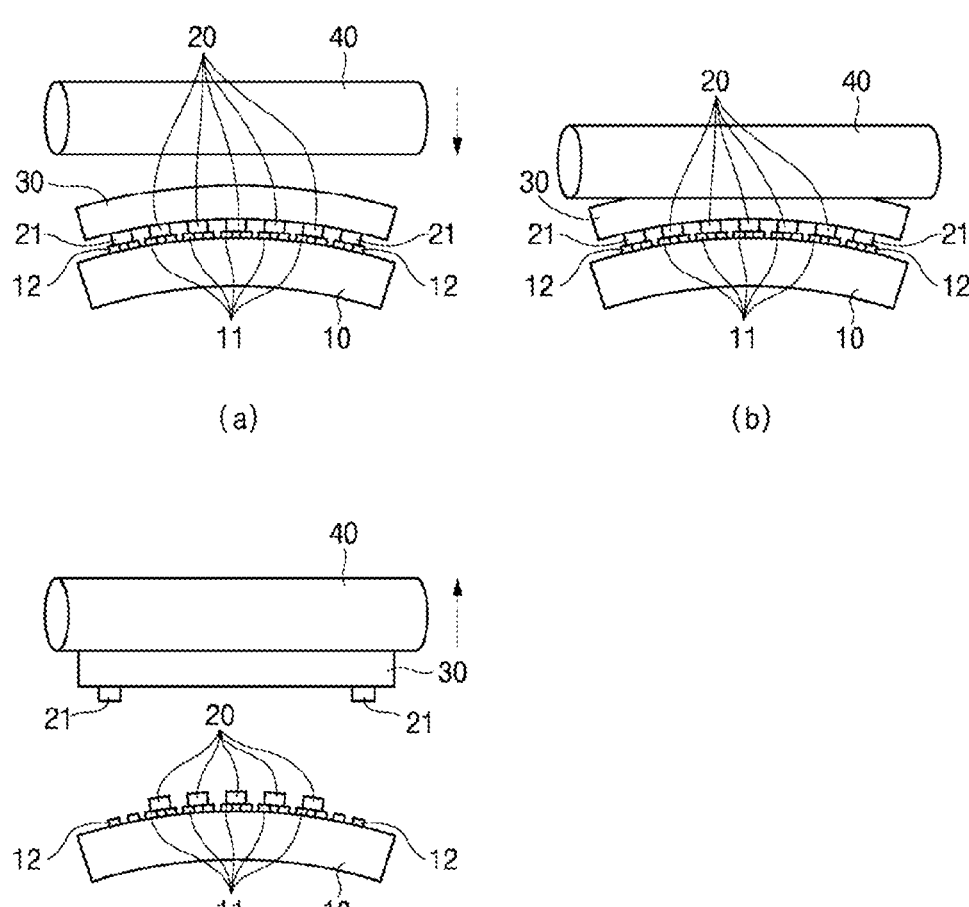
(a)
(b)
(c)

【FIG. 2】
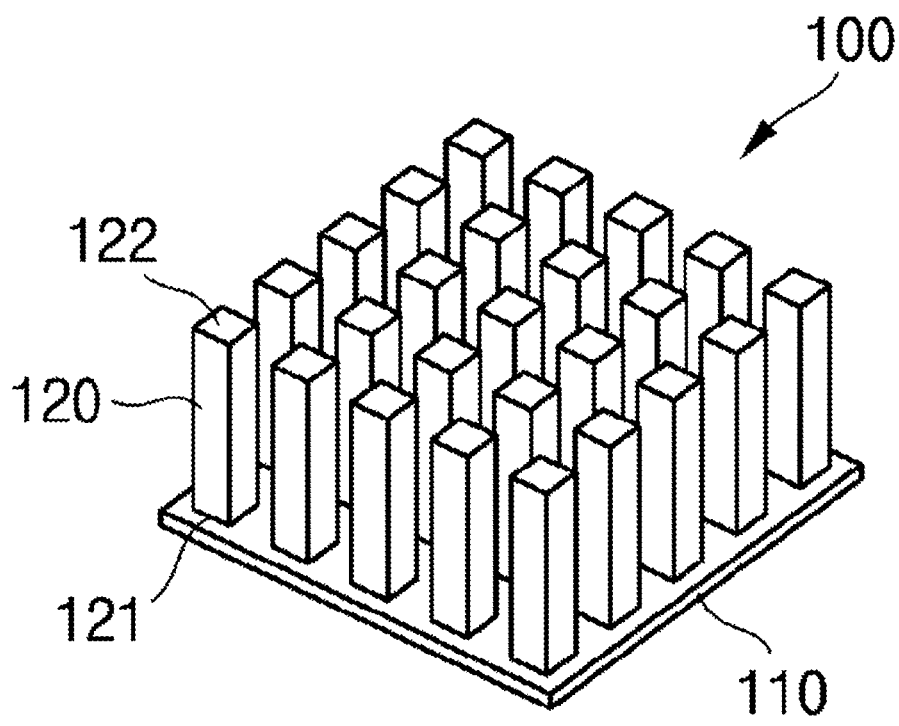

【FIG. 3】
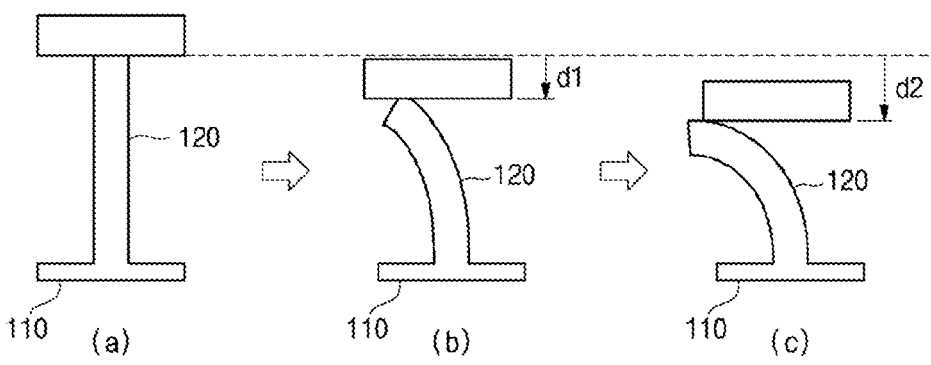
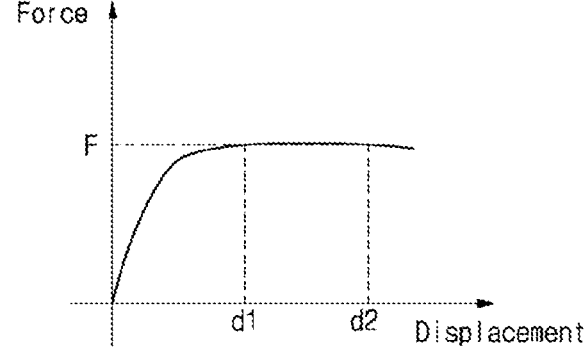

[FIG. 4]
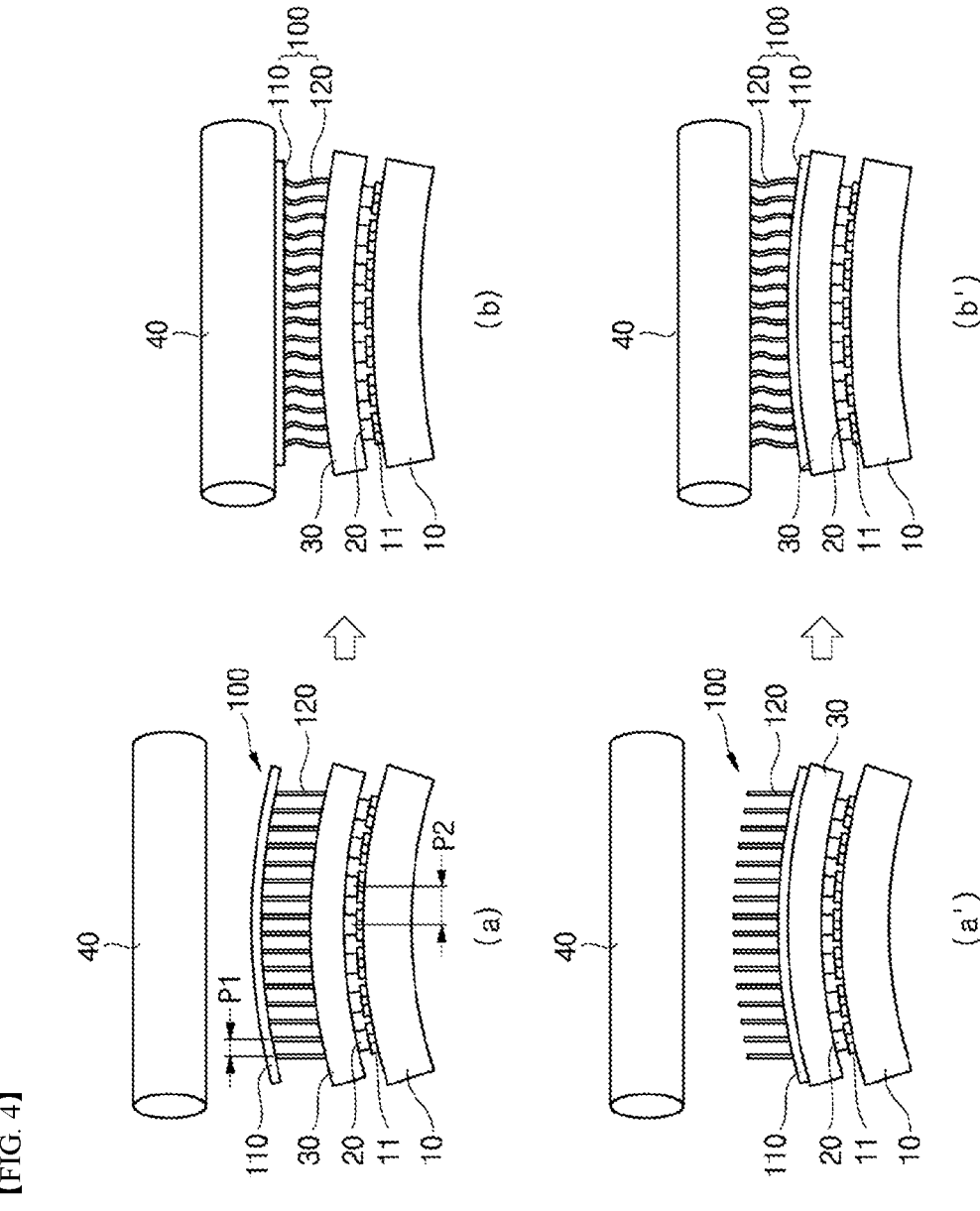

【FIG. 5】
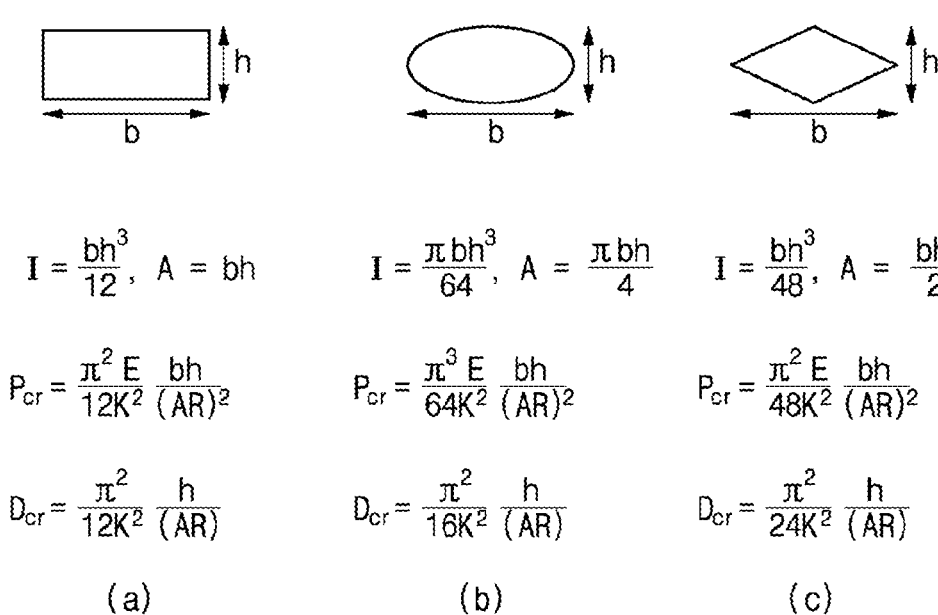
$$I = \frac{bh^3}{12}, \quad A = bh$$
$$P_{cr} = \frac{\pi^2 E}{12K^2} \frac{bh}{(AR)^2}$$
$$D_{cr} = \frac{\pi^2}{12K^2} \frac{h}{(AR)}$$
(a)
$$I = \frac{\pi bh^3}{64}, \quad A = \frac{\pi bh}{4}$$
$$P_{cr} = \frac{\pi^3 E}{64K^2} \frac{bh}{(AR)^2}$$
$$D_{cr} = \frac{\pi^2}{16K^2} \frac{h}{(AR)}$$
(b)
$$I = \frac{bh^3}{48}, \quad A = \frac{bh}{2}$$
$$P_{cr} = \frac{\pi^2 E}{48K^2} \frac{bh}{(AR)^2}$$
$$D_{cr} = \frac{\pi^2}{24K^2} \frac{h}{(AR)}$$
(c)
【FIG. 6】
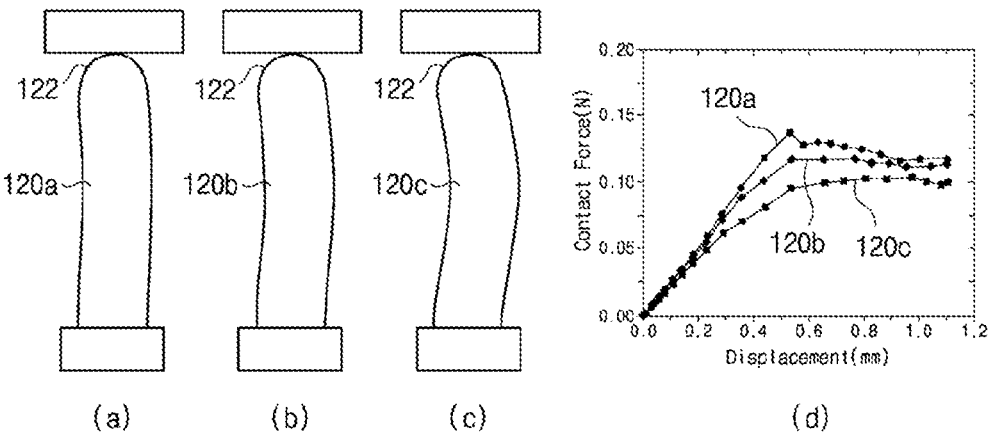
(a)          (b)          (c)          (d)

【FIG. 7】
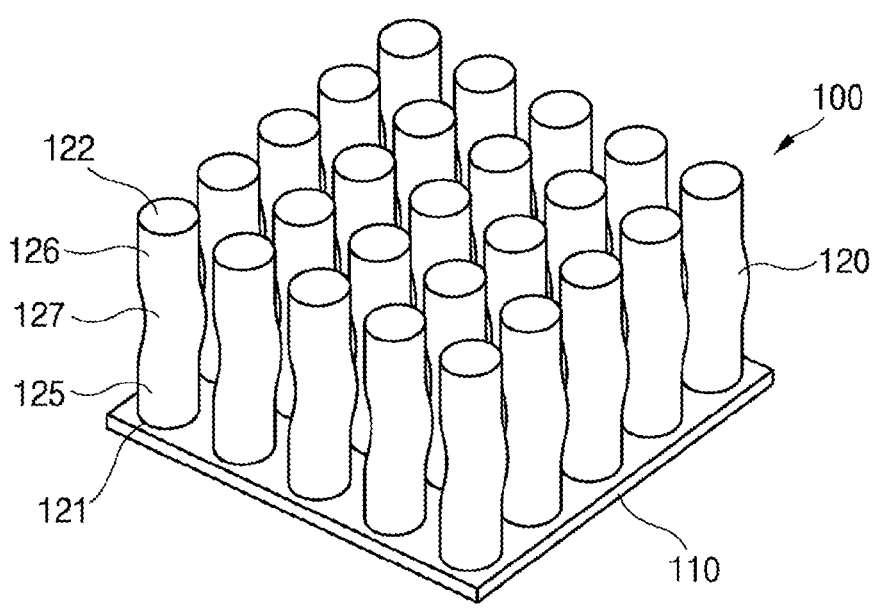
【FIG. 8】
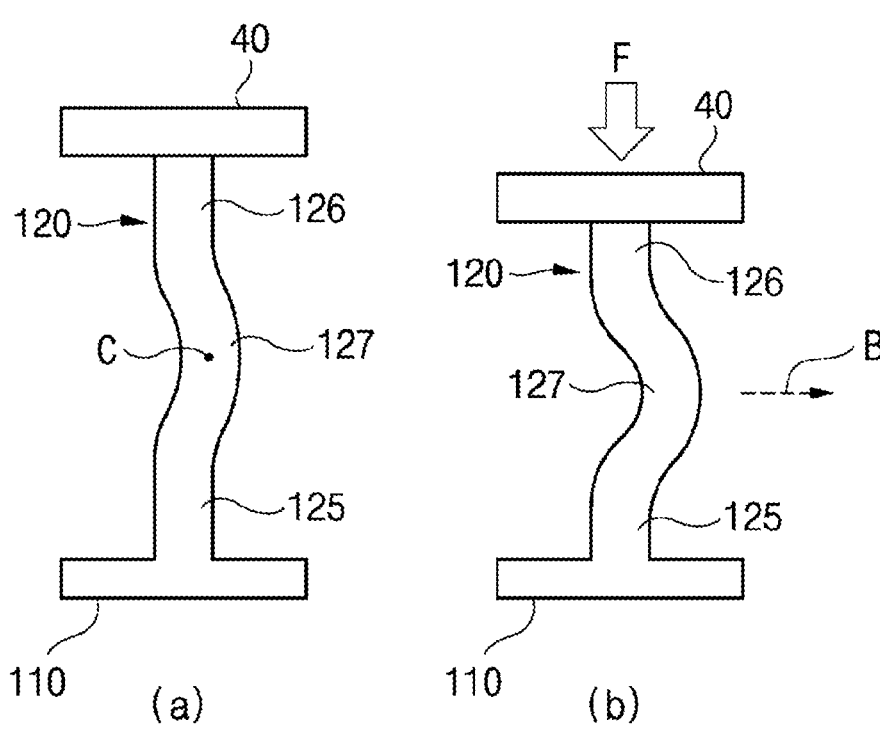
(a)          (b)

【FIG. 9】
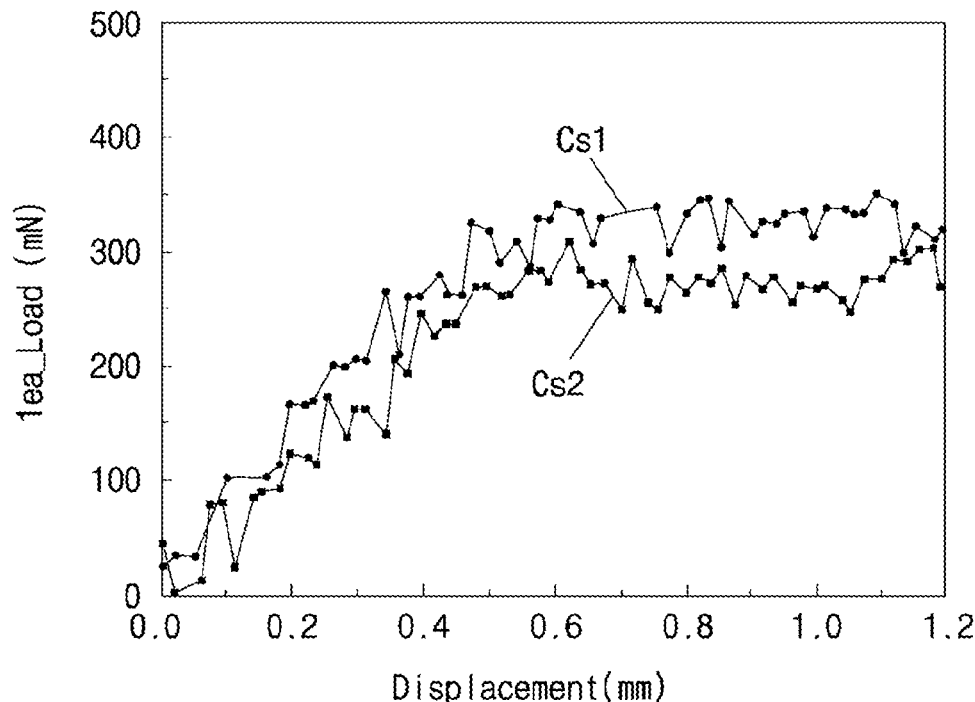

【FIG. 10】
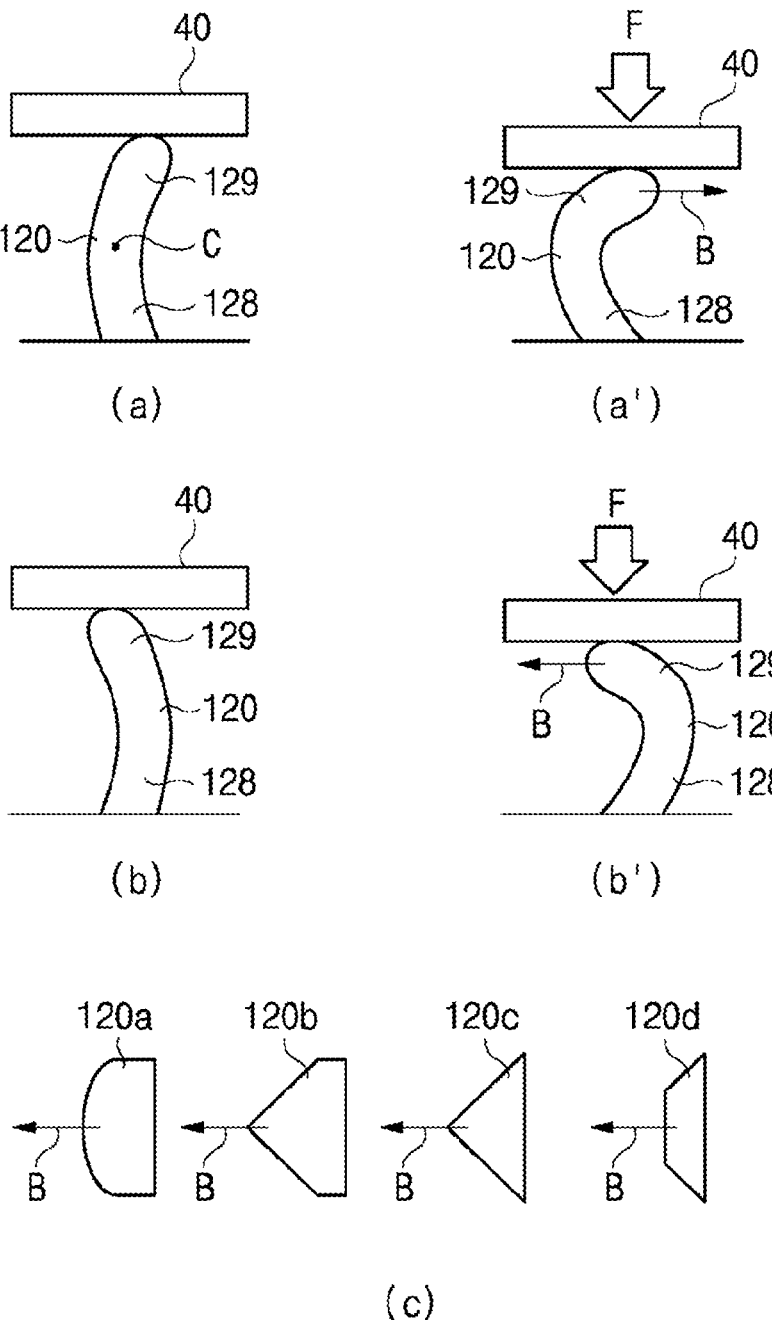

【FIG. 11】
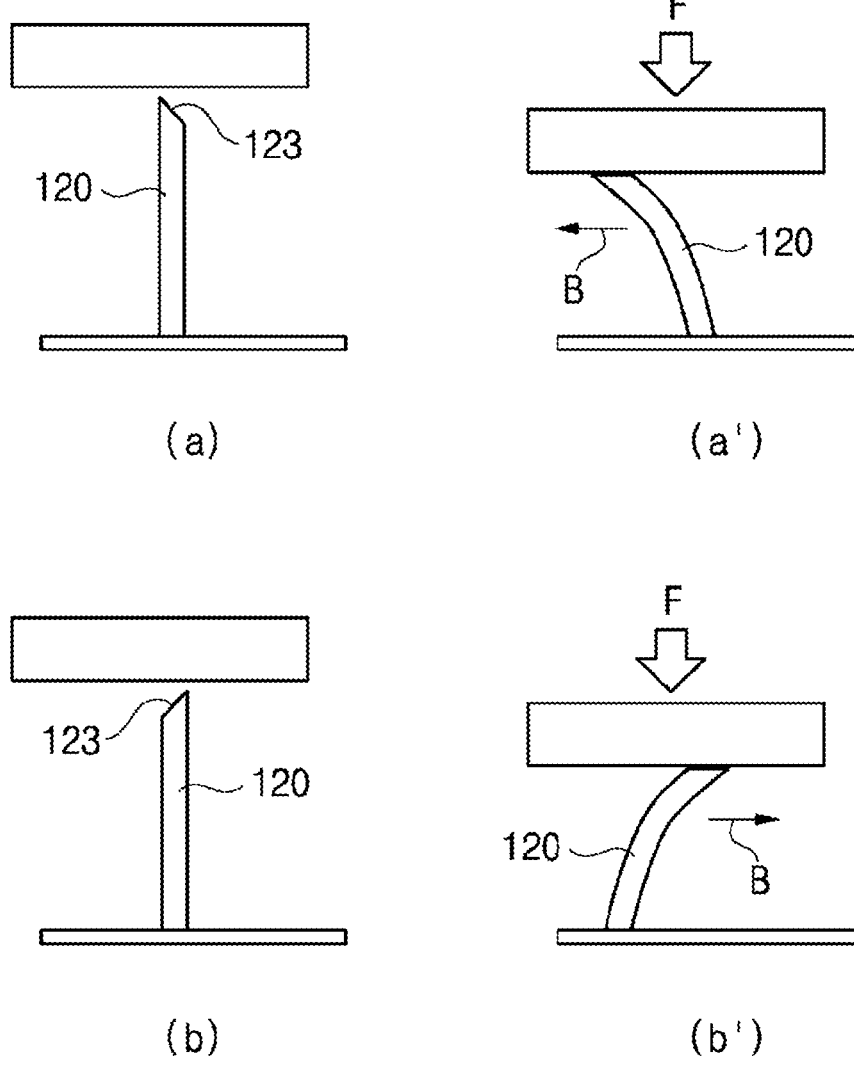
(a)                    (a')
(b)                    (b')

【FIG. 12】
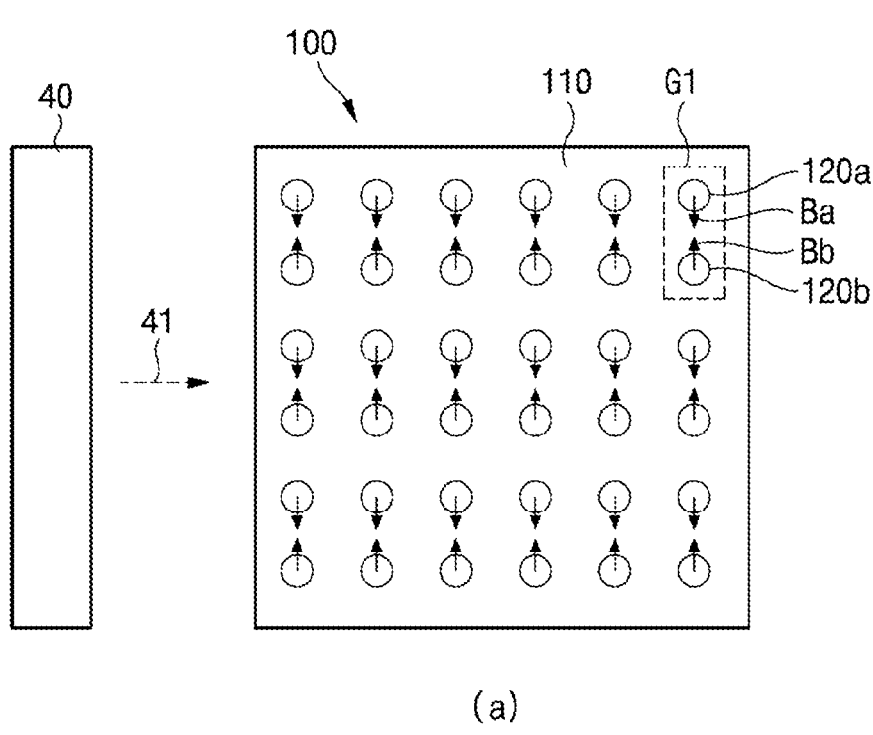
(a)
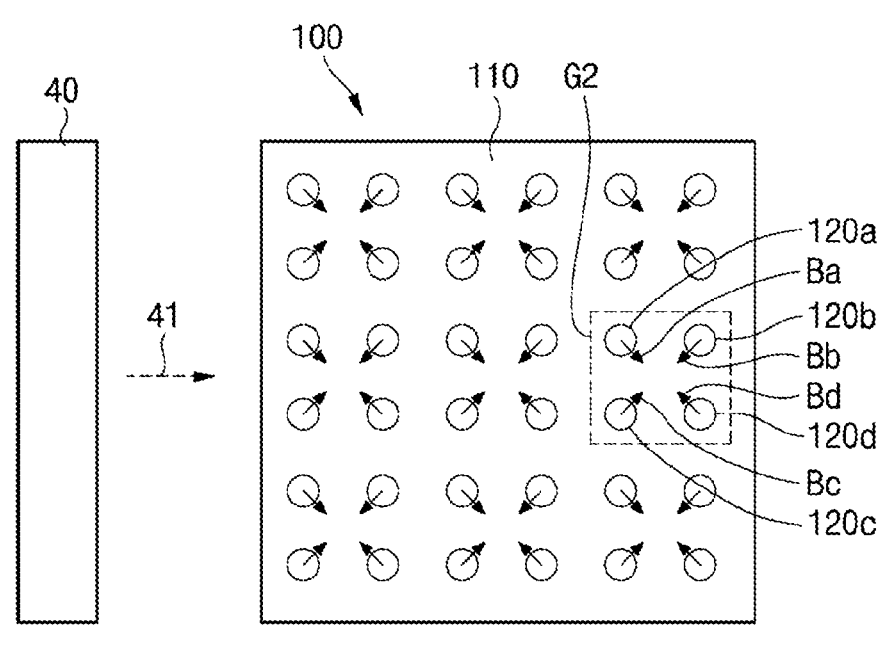
(b)

【FIG. 13】
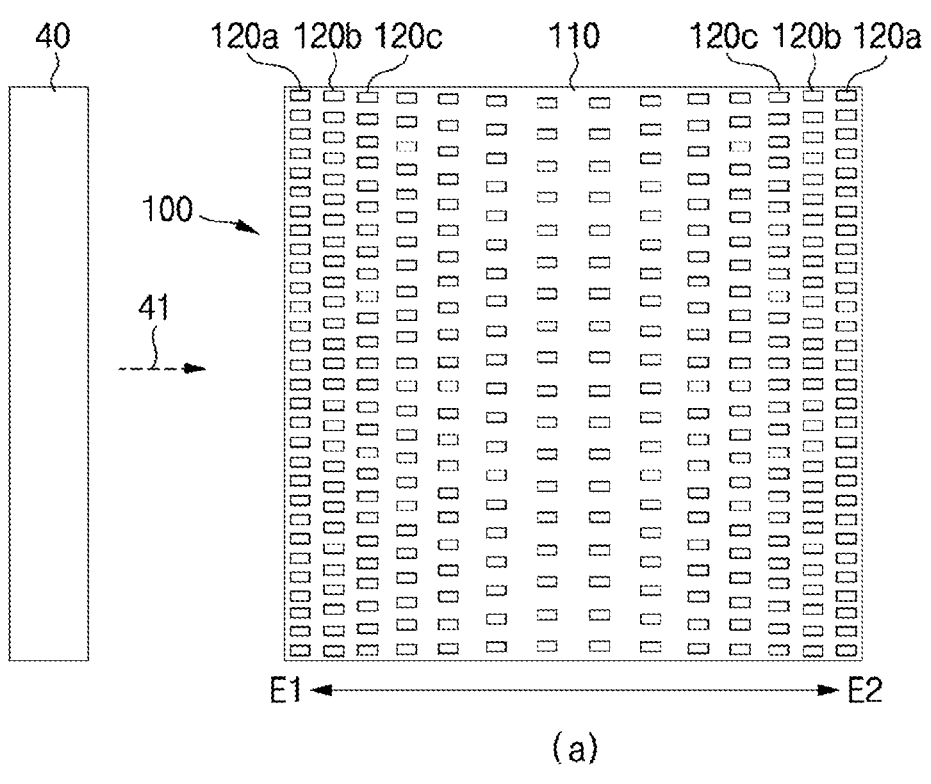
(a)
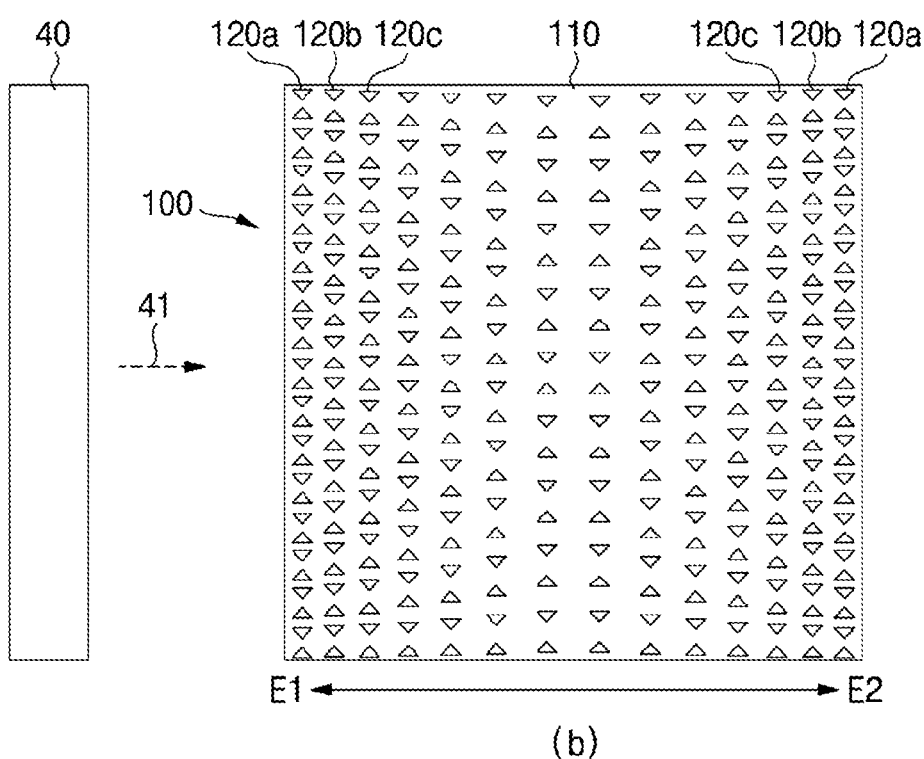
(b)

[FIG. 14]
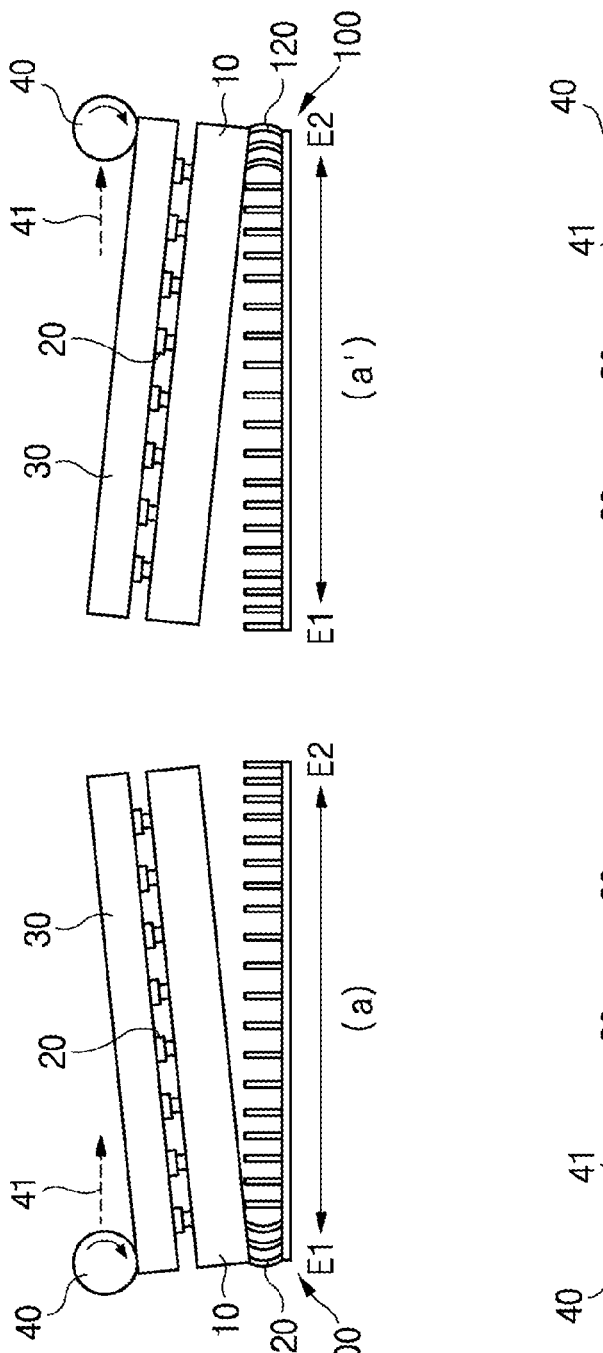
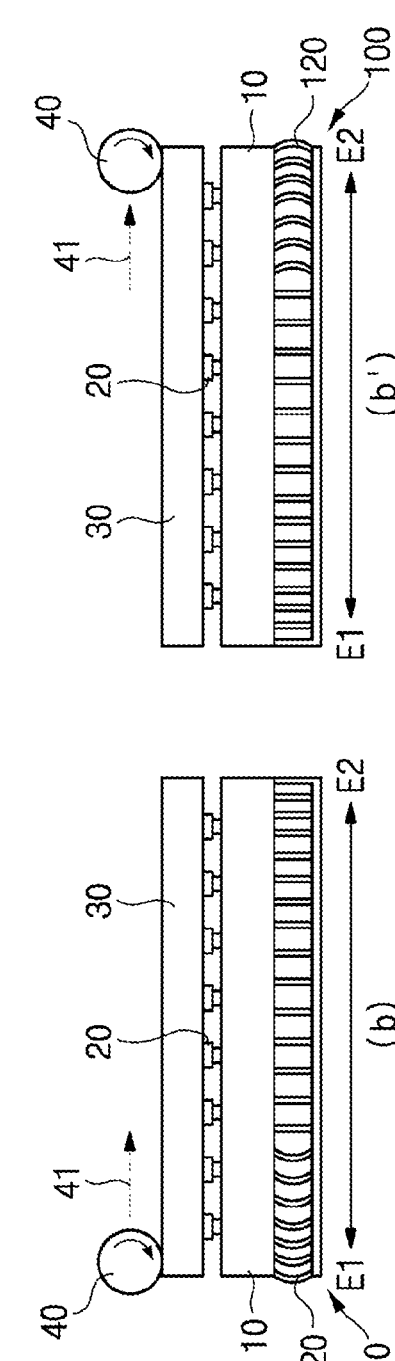

【FIG. 15】
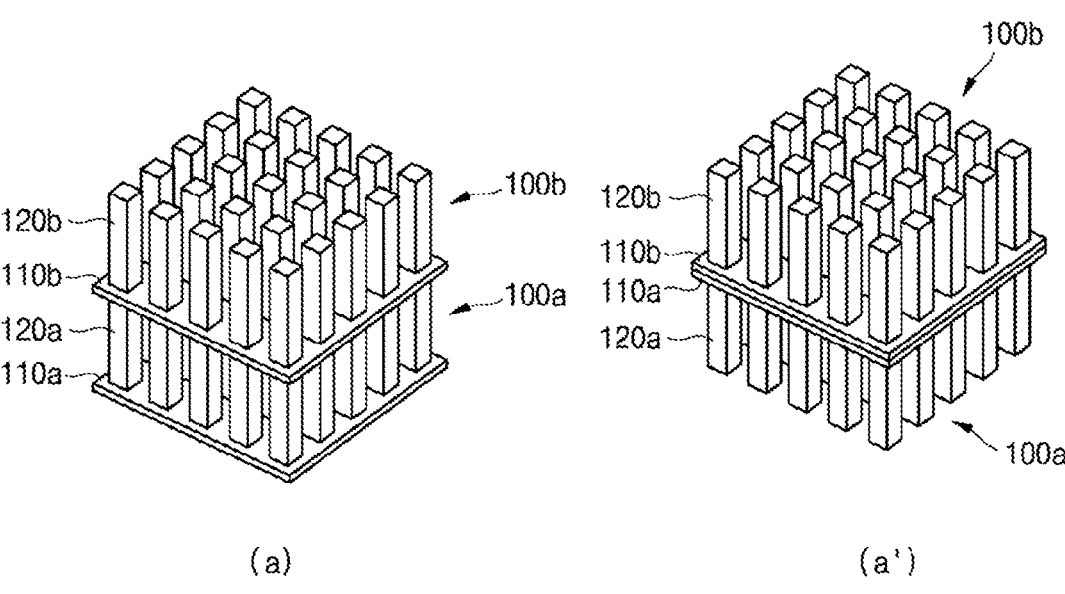
(a)                                    (a')
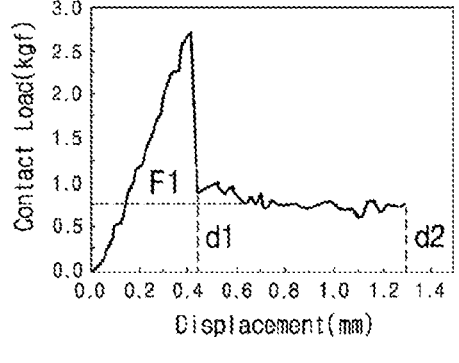
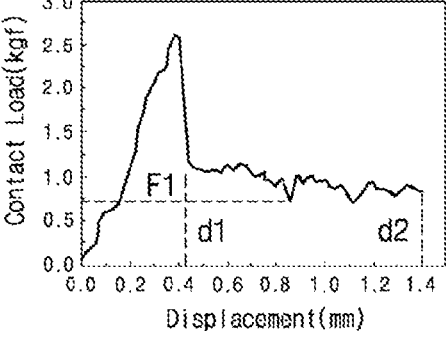
(b)                                    (b')

【FIG. 16】
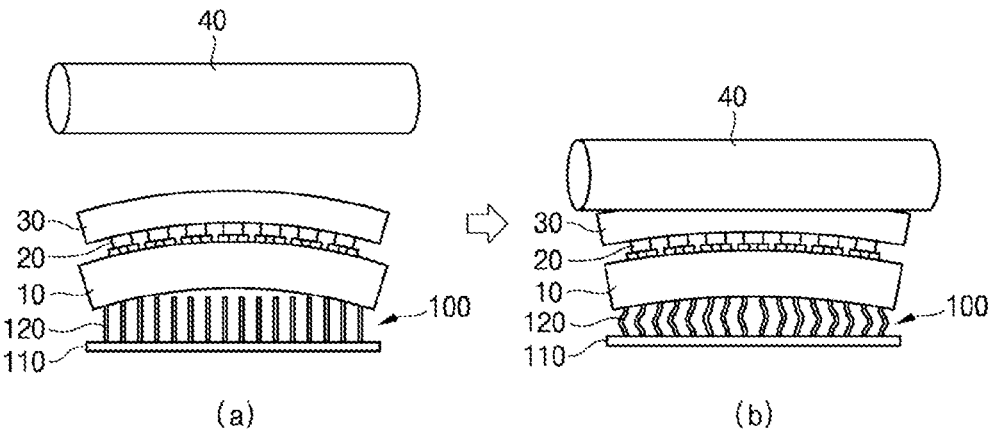
(a)                    (b)
【FIG. 17】
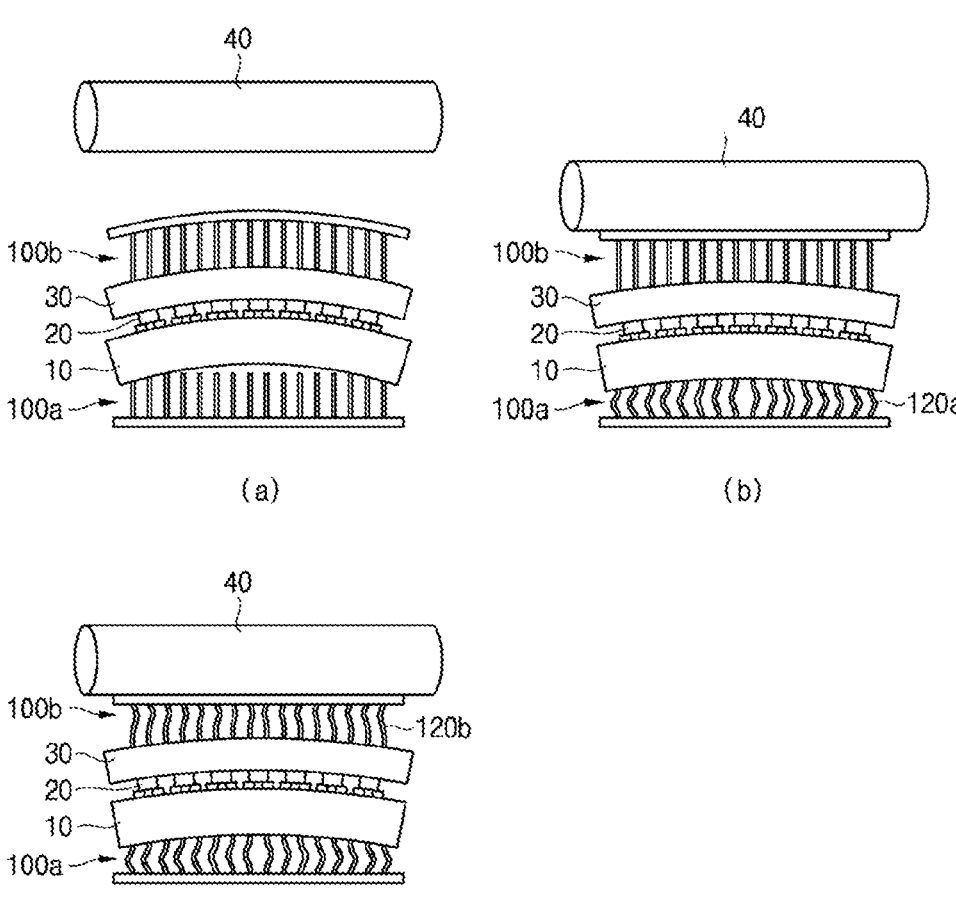
(a)                    (b)
(c)

【FIG. 18】
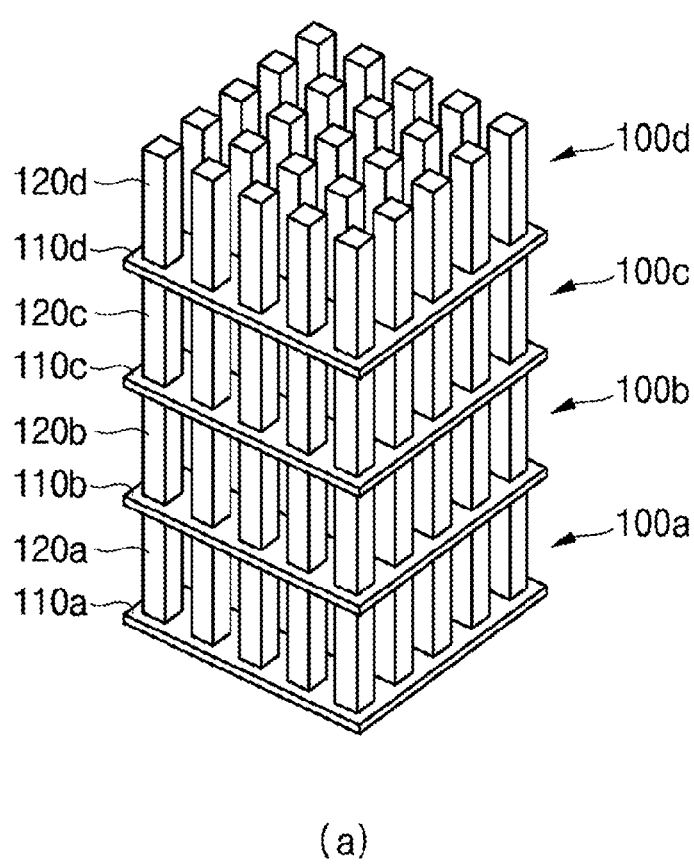
(a)
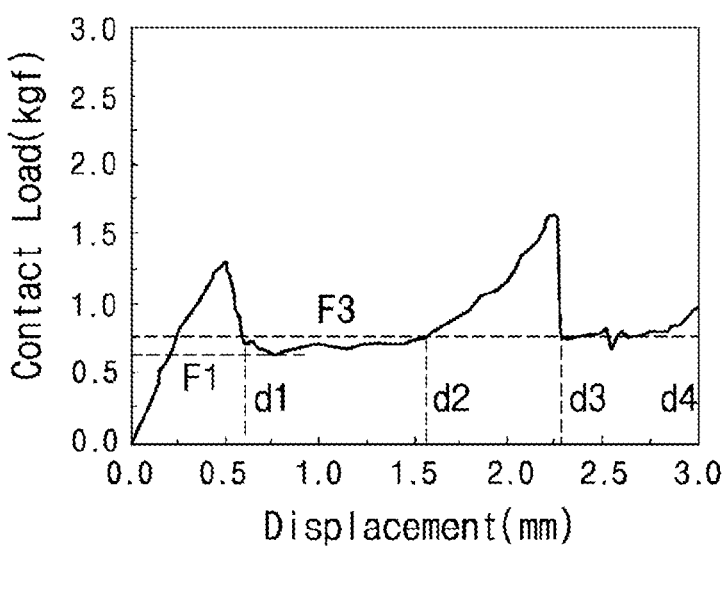
(b)

NON-RIGID PAD FOR DEVICE TRANSFER, METHOD FOR MANUFACTURING NON-RIGID PAD FOR DEVICE TRANSFER, AND NON-RIGID PAD GROUP FOR DEVICE TRANSFER COMPRISING NON-RIGID PAD FOR DEVICE TRANSFER

TECHNICAL FIELD

The present invention relates to a non-rigid pad for device transfer, a method of manufacturing the same, and a non-rigid pad group for device transfer including the same and, more particularly, to a non-rigid pad for device transfer, which allows uniform contact pressure to be applied between multiple devices and a target substrate to which the devices are to be transferred, a method of manufacturing the same, and a non-rigid pad group for device transfer including the same.

BACKGROUND ART

Production equipment used in semiconductor processes, flexible electronics processes, display processes, MEMS processes, LED processes, solar cell processes, and the like requires an apparatus for transferring thin film devices.

For typical thick devices, a transfer process including picking and placing is performed using vacuum chuck technology. However, when applied to thin devices, the vacuum chuck technology has a problem in that the devices can be damaged due to pressure generated by a vacuum chuck. As a result, the vacuum chuck technology is generally not applicable to thin film devices having a thickness of 5 μm or less. In addition, there is a method of transferring devices using an electrostatic chuck. However, when applied to thin devices, this method has a problem in that the devices can be damaged due to static electricity.

For the above reasons, there has been proposed technology for attaching or transferring thin film devices having a very small thickness using van der Waals force acting on a nanoscale. Such thin film devices can be transferred using a transfer apparatus capable of controlling van der Waals force. However, when such a transfer apparatus has a very hard surface, the transfer apparatus cannot be brought into good contact with the thin film devices due to a slight thickness difference between the devices, a curvature of a substrate, and the like, making it impossible to achieve attachment and transfer of the thin film devices. Therefore, a transfer apparatus manufactured using a material having a very low elastic modulus, for example, a polymer or a rubber, is used to transfer such thin film devices. One example of such a transfer apparatus is a flexible stamp.

In general, transfer apparatuses may be classified into a roll type and a plate type.

In the roll-type transfer apparatus, a roller is disposed on a target substrate. Here, the roller is provided on an outer circumferential surface thereof with an adhesive layer to which micro-devices to be transferred to the target substrate are adhesively attached.

In the plate-type transfer apparatus, a pressure plate is disposed on a target substrate. Here, the pressure plate is provided on a lower surface thereof with an adhesive layer to which micro-devices to be transferred to the target substrate are adhesively attached.

In the roll-type transfer apparatus or the plate-type transfer apparatus, it is important to allow uniform contact pressure to be applied between multiple micro-devices and the adhesive layer so as to ensure that the multiple micro-devices are picked from a source substrate to be attached to the adhesive layer or that the multiple micro-devices attached to the adhesive layer are placed on the target substrate.

However, it can be difficult to provide uniform contact pressure between the micro-devices and the adhesive layer due to tolerances for the transfer apparatus, such as machining errors of the roller or the pressure plate and assembly tolerance, height non-uniformity of the micro-devices, warpage of the substrate, and the like.

FIG. 1 is a schematic view illustrating problems of a conventional roll-type transfer process.

Referring to FIG. 1(a), when terminals of devices 20, 21 are temporarily bonded to respective electrodes 11, 12 on a warped target substrate 10, a transfer film 30 is also warped due to warpage of the target substrate 10. When a pressing unit 40, such as a roller, presses the transfer film 30 (see FIG. 1(b)), a desired level of contact pressure occurs between devices 20 and electrodes 11 in a central region, whereas little or no contact pressure occurs between devices 21 and electrodes 12 in an edge region. As a result, the devices 21 at the edge of the transfer film 30 can fail to be transferred to the target substrate 10, as shown in FIG. 1(c).

In addition, when the pressure applied by the pressing unit 40 is increased to transfer the devices 21 at the edge of the transfer film 30 to the target substrate 10, the devices 20 in the central region of the transfer film 30 can be compressed and damaged due to excessive contact pressure occurring in the central region, despite allowing transfer of the devices 21 at the edge of the transfer film 30 to the target substrate 10.

Therefore, there is a need for technology that can solve non-uniformity of contact pressure between multiple devices and a target substrate due to various errors.

DISCLOSURE

Technical Problem

Embodiments of the present invention are conceived to solve such problems in the art and it is an object of the present invention to provide a non-rigid pad for device transfer, which allows uniform contact pressure to be applied between multiple devices and a target substrate to which the devices are to be transferred, a method of manufacturing the same, and a non-rigid pad group for device transfer including the same.

It will be understood that objects of the present invention are not limited to the above. The above and other objects of the present invention will become apparent to those skilled in the art from the detailed description of the following embodiments in conjunction with the accompanying drawings.

Technical Solution

In accordance with one aspect of the present invention, a non-rigid pad for device transfer includes: a base plate; and multiple pillars each protruding from one surface of the base plate with one end thereof connected to the one surface of the base plate, the pillars being bent and deformed upon application of external force, wherein the non-rigid pad is disposed between a transfer film to which multiple devices to be transferred to a target substrate are adhesively attached and a pressing unit providing pressing force to transfer the multiple devices to the target substrate, the non-rigid pad being bent and deformed upon application of pressing force by the pressing unit to allow uniform contact pressure to be applied between the multiple devices and the target substrate.

In some embodiments, the base plate may closely contact the transfer film and the other end of each of the pillars may be disposed to face the pressing unit.

In some embodiments, the other end of each of the pillars may closely contact the transfer film and the base plate may be disposed to face the pressing unit.

In accordance with another aspect of the present invention, a non-rigid pad for device transfer includes: a base plate; and multiple pillars each protruding from one surface of the base plate with one end thereof connected to the one surface of the base plate, the pillars being bent and deformed upon application of external force, wherein the non-rigid pad is disposed under a target substrate to which multiple devices adhesively attached to a transfer film are to be transferred by pressing force applied by a pressing unit, the non-rigid pad being bent and deformed upon application of pressing force by the pressing unit to allow uniform contact pressure to be applied between the multiple devices and the target substrate.

In some embodiments, the base plate may closely contact the target substrate.

In some embodiments, the other end of each of the pillars may closely contact the target substrate.

In accordance with a further aspect of the present invention, a non-rigid pad for device transfer includes: a base plate; and multiple pillars each protruding from one surface of the base plate with one end thereof connected to the one surface of the base plate, the pillars being bent and deformed upon application of external force, wherein the non-rigid pad is disposed both between a transfer film to which multiple devices to be transferred to a target substrate are adhesively attached and a pressing unit providing pressing force to transfer the multiple devices to the target substrate and under the target substrate, the non-rigid pad being bent and deformed upon application of pressing force by the pressing unit to allow uniform contact pressure to be applied between the multiple devices and the target substrate.

In some embodiments, the non-rigid pad may be provided in the form of a stack of two non-rigid pads.

In some embodiments, the two non-rigid pads forming the stack may be identical to each other in terms of a position of the base plate relative to the pillars.

In some embodiments, the two non-rigid pads forming the stack may be opposite to each other in terms of a position of the base plate relative to the pillars.

In some embodiments, the base plate and the pillars may be formed of at least one selected from among silicone rubber, urethane rubber, fluororubber, ethylene-propylene-diene rubber (EPDM), nitrile-butadiene rubber (NBR), and poly(methyl methacrylate) (PMMA).

In some embodiments, each of the pillars may have an asymmetrical cross-sectional shape to control a bending deformation direction of the pillar.

In some embodiments, the pillars may be grouped into pillar groups, wherein pillars belonging to each pillar group may be arranged such that bending deformation directions thereof are symmetric to one another.

In some embodiments, the pressing unit may be a roller, wherein density of the pillars may increase from a center of the base plate toward a front end and a rear end of the base plate with respect to a moving direction of the pressing unit.

In some embodiments, each of the pillars may have a shape bent in one direction to be eccentric in an initial state thereof to be bent and deformed in the initial bending direction thereof upon application of external force.

In some embodiments, each of the pillars may have a first straight portion axially extending from one end of the pillar, a bent portion connected at one end thereof to the first straight portion and bent in one direction to be eccentric, and a second straight portion axially extending from the other end of the bent portion.

In some embodiments, each of the pillars may have a first portion extending obliquely in one direction from one end of the pillar and a second portion connected at one end thereof to the first portion and obliquely extending in an opposite direction with respect to the extension direction of the first portion.

In some embodiments, the other end of the second extension portion may be rounded.

In accordance with yet another aspect of the present invention, a method of manufacturing the non-rigid pad for device transfer includes: fabricating a mold corresponding in shape to the non-rigid pad through a 3D printing process or a LIGA process; and forming the non-rigid pad by injecting a molding liquid into the mold, followed by curing.

In some embodiments, the molding liquid may include at least one selected from among silicone rubber, urethane rubber, fluororubber, ethylene-propylene-diene rubber (EPDM), and nitrile-butadiene rubber (NBR), and may be subjected to room temperature vulcanization or high temperature vulcanization.

In accordance with yet another aspect of the present invention, a non-rigid pad group for device transfer includes a stack of at least three non-rigid pads for device transfer each including a base plate and multiple pillars each protruding from one surface of the base plate with one end thereof connected to the one surface of the base plate, the pillars being bent and deformed upon application of external force, wherein the non-rigid pad group is disposed between a transfer film to which multiple devices to be transferred to a target substrate are adhesively attached and a pressing unit providing pressing force to transfer the multiple devices to the target substrate, the non-rigid pad group is primarily bent and deformed upon application of pressing force by the pressing unit to allow uniform contact pressure having a first value to be applied between the multiple devices and the target substrate, and the non-rigid pad group is secondarily bent and deformed upon application of increased pressing force by the pressing unit to allow uniform contact pressure having a second value greater than the first value to be applied between the multiple devices and the target substrate.

In accordance with yet another aspect of the present invention, a non-rigid pad group for device transfer includes a stack of at least three non-rigid pads for device transfer each including a base plate and multiple pillars each protruding from one surface of the base plate with one end thereof connected to the one surface of the base plate, the pillars being bent and deformed upon application of external force, wherein the non-rigid pad group is disposed under a target substrate to which multiple devices adhesively attached to a transfer film are to be transferred by pressing force applied by a pressing unit, the non-rigid pad group is primarily bent and deformed upon application of pressing force by the pressing unit to allow uniform contact pressure having a first value to be applied between the multiple devices and the target substrate, and the non-rigid pad group is secondarily bent and deformed upon application of increased pressing force by the pressing unit to allow uniform contact pressure having a second value greater than the first value to be applied between the multiple devices and the target substrate.

Advantageous Effects

The non-rigid pad for device transfer according to the embodiments of the present invention has a zero-stiffness region in which a constant load is generated over a specific displacement range. Thus, even when a pressing unit cannot provide uniform pressing force due to various error factors, the non-rigid pad allows uniform contact pressure to be applied between multiple devices and a target substrate, thereby ensuring stable and effective transfer of devices.

It will be understood that advantageous effects of the present invention are not limited to the above and include any advantageous effects conceivable from the features disclosed in the detailed description of the present invention or the appended claims.

DESCRIPTION OF DRAWINGS

FIG. 1 is a schematic view illustrating problems of a conventional roll-type transfer process.

FIG. 2 is a perspective view of a non-rigid pad for device transfer according to one embodiment of the present invention.

FIG. 3 shows shape deformation of the non-rigid pad of FIG. 2 and a displacement/load graph upon shape deformation of the non-rigid pad.

FIG. 4 is a schematic view illustrating a first exemplary application of the non-rigid pad of FIG. 2.

FIG. 5 is a schematic view illustrating changes in moment of inertia, cross-sectional area, critical load, and critical displacement of the pillar of FIG. 2 depending on the cross-sectional shape of the pillar.

FIG. 6 shows pillars of the non-rigid pad of FIG. 2 according to another embodiment of the present invention and displacement/load curves thereof.

FIG. 7 is a perspective view illustrating pillars of the non-rigid pad of FIG. 2 according to yet another embodiment of the present invention.

FIG. 8 is a schematic view illustrating a bending deformation direction of the non-rigid pad of FIG. 7.

FIG. 9 is a displacement/load graph upon shape deformation of the non-rigid pad of FIG. 7.

FIG. 10 is a schematic view illustrating a bending deformation direction of a pillar of the non-rigid pad according to another embodiment of the present invention.

FIG. 11 is a schematic view illustrating a bending deformation direction of a pillar of the non-rigid pad of FIG. 2 according to yet another embodiment of the present invention.

FIG. 12 is a schematic view illustrating arrangement of the pillars of the non-rigid pad of FIG. 2.

FIG. 13 is a schematic view illustrating arrangement of the pillars of the non-rigid pad of FIG. 2.

FIG. 14 is a schematic view illustrating a device transfer process using the non-rigid pad of FIG. 13.

FIG. 15 shows another example of the first exemplary application of the non-rigid pad of FIG. 2 and a displacement/load graph thereof.

FIG. 16 is a schematic view illustrating a second exemplary application of the non-rigid pad of FIG. 2.

FIG. 17 is a schematic view illustrating a third exemplary application of the non-rigid pad of FIG. 2.

FIG. 18 shows an exemplary application of a non-rigid pad group for device transfer and a displacement/load graph of the non-rigid pad group, wherein the non-rigid pad group is a group of non-rigid pads as shown in FIG. 2.

LIST OF REFERENCE NUMERALS

10: Target substrate
20: Device
30: Transfer film
40: Pressing unit
100: Non-rigid pad for device transfer
110: Base plate
120: Pillar

MODE FOR INVENTION

Reference will now be made in detail to various embodiments, examples of which are illustrated in the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

Throughout the specification, when an element or layer is referred to as being "on," "connected to," or "coupled to" another element or layer, it may be directly on, connected to, or coupled to the other element or layer or intervening elements or layers may be present. In addition, unless stated otherwise, the term "includes" should be interpreted as not excluding the presence of other components than those listed herein.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described with reference to the accompanying drawings.

FIG. 2 is a perspective view of a non-rigid pad for device transfer according to one embodiment of the present invention, and FIG. 3 shows shape deformation of the non-rigid pad of FIG. 2 and a displacement/load graph upon shape deformation of the non-rigid pad.

Referring to FIG. 2 and FIG. 3, a non-rigid pad 100 according to this embodiment may include a base plate 110 and multiple pillars 120.

The base plate 110 may be flat, and each of the pillars 120 may protrude from the base plate 110 with one end 121 thereof connected to one surface of the base plate 110. The pillar 120 may be bent and deformed upon application of external force, wherein external force may be applied to the other end 122 of the pillar 120. Here, bending deformation of the pillar 120 may include buckling.

The base plate 110 and the pillar 120 may be formed of at least one selected from among silicone rubber, urethane rubber, fluororubber, ethylene-propylene-diene rubber (EPDM), nitrile-butadiene rubber (NBR), poly(methyl methacrylate) (PMMA), and an epoxy-based negative photoresist.

In one embodiment, the non-rigid pad for device transfer may be directly manufactured through a photolithography process using a UV light source, a 3D printing process, or a LIGA process using X-rays. Here, as a material for the non-rigid pad, at least one selected from among silicone rubber, PMMA, and an epoxy-based negative photoresist may be used.

In another embodiment, the non-rigid pad for device transfer may be manufactured by a method including: fabricating a mold corresponding in shape to the non-rigid pad through a 3D printing process or a LIGA process; and forming the non-rigid pad by injecting a molding liquid into the mold, followed by curing.

The molding liquid may include at least one selected from among silicone rubber, urethane rubber, fluororubber, EPDM, and NBR. The molding liquid may be subjected to room temperature vulcanization or high temperature vulcanization.

Referring to FIG. 3, even when the pillar 120 is bent and deformed by a first displacement d1 and then is further bent and deformed to a second displacement d2 greater than the first displacement d1, the non-rigid pad 100 according to the present invention can generate a constant load F over a displacement range from the first displacement d1 to the second displacement d2. That is, the non-rigid pad 100 may have a zero-stiffness region in which a load F generated by bending deformation thereof is maintained constant in a displacement range from the first displacement d1 to the second displacement d2.

In other words, upon compressive deformation of the non-rigid pad 100 by external force, a load generated by the non-rigid pad 100 does not increase in a specific displacement range. This means that, when a pressing unit provides an appropriate magnitude of force such that the non-rigid pad 100 is deformed within the specific displacement range, uniform contact pressure can be applied between multiple devices and a target substrate.

Accordingly, even when uniform pressing force cannot be applied to a transfer film due to machining errors of a component applying pressing force to the transfer film, such as a pressing unit, thickness errors of the transfer film, assembly errors between various components including the pressing unit, or load control errors occurring in the process of controlling pressing force applied to devices, uniform contact pressure can be applied between the devices and the target substrate by providing an appropriate magnitude of pressing force such that the non-rigid pad 100 is deformed within the specific displacement range. The pressing unit 40 may include a roller or a planar stamp. Hereinafter, it is assumed that the pressing unit 40 is a roller, for convenience of description.

FIG. 4 is a schematic view illustrating a first exemplary application of the non-rigid pad of FIG. 2.

Referring to FIG. 4, the non-rigid pad 100 may be disposed between a transfer film 30 to which multiple devices 20 to be transferred to respective electrodes 11 on a target substrate 10 are adhesively attached and a pressing unit 40 providing pressing force to transfer the multiple devices 20 to the target substrate 10.

The non-rigid pad 100 disposed as above may be bent and deformed upon application of pressing force by the pressing unit 40 to allow uniform contact pressure to be applied between the multiple devices 20 and the target substrate 10.

In one embodiment, the non-rigid pad 100 may be disposed such that the other end of the pillar 120 closely contacts the transfer film 30 and the base plate 110 is disposed to face the pressing unit 40, as shown in FIG. 4(a) and FIG. 4(b). This arrangement may be used when it is difficult to dispose the non-rigid pad 100 under the target substrate 10.

The non-rigid pad 100 may be pressed against the pressing unit 40 after being disposed on the transfer film 30, as shown in FIG. 4, or may be wrapped around an outer circumferential surface of the pressing unit 40.

In another embodiment, the non-rigid pad 100 may be disposed such that the base plate 110 closely contacts the transfer film 30 and the other end of the pillar 120 is disposed to face the pressing unit 40, as shown in FIG. 4(a') and FIG. 4(b').

Preferably, a pitch P1 between adjacent pillars 120 of the non-rigid pad 100 is smaller than a pitch P2 between adjacent devices 20. In addition, a cross-sectional area of the pillar 120 of the non-rigid pad 100 is preferably smaller than the pitch P2 between adjacent devices 20.

Force required for bending deformation of the non-rigid pad 100 increases with increasing cross-sectional area of the pillar 120, with decreasing length of the pillar 120, or with increasing elastic modulus of the pillar 120. Accordingly, a critical displacement and a critical load causing bending deformation of the pillar 120 may be controlled through regulation of the cross-sectional area of the pillar 120, regulation of the length of the pillar 120, or regulation of the elastic modulus of the pillar 120 through material changes.

FIG. 5 is a schematic view illustrating changes in moment of inertia, cross-sectional area, critical load, and critical displacement of the pillar of FIG. 2 depending on the cross-sectional shape of the pillar.

FIG. 5(a) shows the moment of inertia I, cross-sectional area A, critical load Pcr, and critical displacement Dcr of a pillar having a rectangular cross-section, FIG. 5(b) shows the moment of inertia I, cross-sectional area A, critical load Pcr, and critical displacement Dcr of a pillar having an elliptical cross-section, and FIG. 5(c) shows the moment of inertia I, cross-sectional area A, critical load Pcr, and critical displacement Dcr of a pillar having a rhombic cross-section.

Referring to FIG. 5, for a given cross-sectional horizontal length b and vertical length h of the pillar 120, the critical displacement of the pillar 120 may decrease with decreasing ratio (I/A) of the moment of inertia I of the pillar 120, which depends on the cross-sectional shape of the pillar 120, to the cross-sectional area A of the pillar 120. That is, a critical displacement factor of the pillar 120 decreases in the following order: rectangular cross-section ($\frac{1}{12}$)>elliptical cross-section ($\frac{1}{16}$)>rhombic cross-section ($\frac{1}{24}$).

In addition, for a given cross-sectional horizontal length b and vertical length h of the pillar 120, the critical load of the pillar 120 depends on the moment of inertia I. That is, a critical load factor of the pillar 120 decreases in the following order: rectangular cross-section ($\pi^2/12$)>elliptical cross-section ($\pi^3/64$)>rhombic cross-section ($\pi^2/48$).

Accordingly, a critical displacement and a critical load causing bending deformation of the pillar 120 may be controlled through appropriate selection of the cross-sectional shape of the pillar 120.

In FIG. 5, E is an elastic modulus of a material forming the pillar 120, AR is an aspect ratio of the pillar 120, that is, a ratio L/h of the length L of the pillar 120 to the cross-sectional vertical length h of the pillar 120, and K is an effective length factor of the pillar 120.

In addition, a critical displacement and a critical load causing bending deformation of the pillar 120 may decrease with increasing aspect ratio AR of the pillar 120.

FIG. 6 shows pillars of the non-rigid pad of FIG. 2 according to another embodiment of the present invention and displacement/load curves thereof, wherein a pillar 120a of FIG. 6(a) may have an eccentricity of 50 μm, a pillar 120b of FIG. 6(b) may have an eccentricity of 100 μm, and a pillar 120c of FIG. 6(c) may have an eccentricity of 200 μm.

Referring to FIG. 6, each of the pillars 120a, 120b, 120c may have the same convex shape at the other end 122 thereof. When each of the pillars 120a, 120b, 120c has the same convex shape at the other end 122 thereof, the pillars 120a, 120b, 120c may have an almost identical non-stiffness region since a constraint due to the degree of eccentricity of the pillars 120a, 120b, 120c is small.

FIG. 7 is a perspective view illustrating pillars of the non-rigid pad of FIG. 2 according to yet another embodiment of the present invention, and FIG. 8 is a schematic view illustrating a bending deformation direction of the non-rigid pad of FIG. 7.

Referring to FIG. 7 and FIG. 8, a pillar 120 according to this embodiment may have a shape bent in one direction to be eccentric in an initial state thereof.

The pillar 120 may have a first straight portion 125, a second straight portion 126, and a bent portion 127.

The first straight portion 125 may extend from one end 121 of the pillar 120 in an axial direction of the pillar 120.

The bent portion 127 may be connected at one end thereof to the first straight portion 125, and may be bent in one direction to be eccentric.

The second straight portion 127 may be connected to the other end of the bent portion 127, and may extend in the axial direction of the pillar 120. The second straight portion 126 may have the same central axis as the first straight portion 15. Accordingly, the bent portion 127 may be bent in one direction between the first straight portion 125 and the second straight portion 126, and may be eccentric in one direction.

The pillar 120 may be symmetric with respect to a center C thereof. That is, the bent portion 127 may be symmetric with respect to the center C and the first straight portion 125 and the second straight portion 126 may have the same length. However, it should be understood that the pillar 120 is not necessarily symmetric with respect to the center C thereof.

Upon application of force F to the pillar 120, the pillar 120 may be bent and deformed in the initial bending direction thereof. In this way, a bending deformation direction B of the pillar 120 can be controlled. That is, when the bent portion 127 is bent in one direction to be eccentric in an initial state thereof, the bent portion 127 can be bent and deformed in the initial bending direction thereof upon application of force F by the pressing unit 40. Thus, taken as a whole, the pillar 120 can be bent and deformed in one direction. That is, when the pillar 120 is bent to the right in the initial state thereof, as shown in FIG. 7, the pillar 120 may be bent and deformed to the right upon application of force F.

In addition, since the pillar 120 is bent in one direction to be eccentric in the initial state thereof, bending deformation of the pillar 120 can progress slowly and thus the pillar 120 can stably exhibit zero-stiffness properties without appearance of a negative stiffness region.

FIG. 9 is a displacement/load graph upon shape deformation of the non-rigid pad of FIG. 7. Specifically, FIG. 9 shows displacement/load curves of a pillar having a bent portion having a curve (Cs1) of 8.21 degrees and a pillar having a bent portion having a curve (Cs2) of 8.27 degrees upon application of vertical force to each of the pillars, wherein the pillars are formed of room-temperature-vulcanizing (RTV) silicone rubber.

Referring to FIG. 9, it can be seen that both the pillar having the bent portion having a curve (Cs1) of 8.21 degrees and the pillar having the bent portion having a curve (Cs2) of 8.27 degrees exhibit zero-stiffness properties, that is, the ability to generate a constant load, without appearance of a negative stiffness section in a displacement range greater than about 0.6 mm.

FIG. 10 is a schematic view illustrating a bending deformation direction of a pillar of the non-rigid pad according to another embodiment of the present invention.

Referring to FIG. 10, a pillar 120 according to this embodiment may have a first portion 128 and a second portion 129.

The first portion 128 may extend obliquely in one direction from one end of the pillar 120.

The second portion 129 may be connected at one end thereof to the first portion 128, and may extend obliquely in an opposite direction with respect to the extension direction of the first portion 128. That is, the pillar 120 according to this embodiment has a similar shape to the pillar of FIG. 7 with the first and second straight portions omitted therefrom. In this way, bending deformation of the pillar 120 can progress more slowly due to reduction in overall height of the pillar 120, whereby the pillar 120 can exhibit zero-stiffness properties in a more stable manner. The first portion 128 and the second portion 129 may be symmetric with each other and may have the same length, without being limited thereto.

The pillar 120 according to this embodiment may also have a shape bent in one direction to be eccentric in an initial state thereof so as to control a bending deformation direction B of the pillar 120. That is, when the pillar 120 is bent in one direction in the initial state thereof, as shown in FIG. 10(a), the pillar 120 may be bent and deformed in the initial bending direction thereof upon application of force F. That is, when the pillar 120 is bent to the right in the initial state thereof, as shown in FIG. 10(a), the pillar 120 may be bent and deformed to the right upon application of force F (see FIG. 10(a')).

Similarly, when the pillar 120 is bent to the left in the initial state thereof, as shown in FIG. 10(b), the pillar 120 may be bent and deformed to the left upon application of force F (see FIG. 10(b')).

Referring to FIG. 10(c), the pillar 120 may have an asymmetric cross-section 120a, 120b, 120c, or 120d so as to control a bending deformation direction B of the pillar 120. Specifically, the asymmetric cross-section of the pillar 120 may be obtained by adding or removing one or more shapes selected from among a semi-ellipse, a rectangle, a triangle, and a trapezoid.

In addition, the second portion 129 may be rounded at the other end thereof. In this way, even when the pillar 120 has a small aspect ratio AR, the pillar 120 can stably exhibit zero-stiffness properties without appearance of a negative stiffness section.

FIG. 11 is a schematic view illustrating a bending deformation direction of a pillar of the non-rigid pad of FIG. 2 according to yet another embodiment of the present invention.

Referring to FIG. 11, a pillar 120 according to this embodiment may have a slope 123 formed at one end thereof. In this embodiment, a bending deformation direction B of the pillar 120 may be controlled by the direction in which the slope 123 faces.

That is, when the slope 123 formed at the one end of the pillar 120 faces in one direction, as shown in FIG. 11(*a*), the pillar 120 may be bent and deformed in an opposite direction with respect to the direction in which the slope 123 faces upon application of force F. That is, when the slope 123 faces to the right, as shown in FIG. 11(*a*), the pillar 120 may be bent and deformed to the left upon application of force F (see FIG. 11(*a*)).

Similarly, when the slope 123 faces to the left, as shown in FIG. 11(*b*), the pillar 120 may be bent and deformed to the right upon application of force F (see FIG. 11(*b'*)).

FIG. 12 is a schematic view illustrating arrangement of the pillars of the non-rigid pad of FIG. 2.

Referring to FIG. 12(*a*), the pillars of the non-rigid pad 100 may be grouped into pillar groups G1. Here, pillars 120*a*, 120*b* belonging to each pillar group G1 may be arranged such that bending deformation directions Ba, Bb thereof are symmetric to each other.

If all the pillars 120 of the non-rigid pad 100 are bent and deformed in the same direction, pushing force can be applied by the non-rigid pad 100 to the transfer film 30 in the same in-plane direction not only when the pressing unit 40 is a roller sequentially pressing the non-rigid pad 100 while moving in one direction, but also when the pressing unit is a planar stamp. As a result, in-plane displacement can occur in the transfer film 30.

Conversely, when the pillars 120*a*, 120*b* in each pillar group G1 are arranged such that bending deformation directions Ba, Bb thereof are symmetric to each other, in-plane displacements due to bending deformation of the pillars 120*a*, 120*b* can cancel each other out, thereby preventing occurrence of in-plane displacement in the transfer film 30.

The number of pillars in each pillar group is not particularly restricted, and any suitable number of pillars may be included in each pillar group.

That is, referring to FIG. 12(*b*), each pillar group G2 may include four pillars 120*a*, 120*b*, 120*c*, 120*d*. Here, the pillars 120*a*, 120*b*, 120*c*, 120*d* may be arranged such that bending deformation directions thereof Ba, Bb, Bc, Bd are symmetric to one another to allow in-plane displacements due to bending deformation of the pillars 120*a*, 120*b*, 120*c*, 120*d* to cancel one another out.

FIG. 13 is a schematic view illustrating arrangement of the pillars of the non-rigid pad of FIG. 2, and FIG. 14 is a schematic view illustrating a device transfer process using the non-rigid pad of FIG. 13.

Referring to FIG. 13, when the pressing unit 40 is a roller sequentially pressing the non-rigid pad 100 while moving in one direction 41, the non-rigid pad 100 may be increased in pillar density toward a front end E1 and a rear end E2 thereof with respect to the moving direction of the pressing unit 40. In other words, the density of the pillars may be increased from the center of the base plate 110 toward the front end E1 and the rear end E2 of the non-rigid pad 100 with respect to the moving direction of the pressing unit 40. That is, density of pillars 120*a*>density of pillars 120*b*>density of pillars 120*c*.

As described above, the pillars of the non-rigid pad may have an asymmetrical cross-sectional shape obtained by adding or removing one or more shapes selected from a semi-ellipse, a rectangle, a triangle, and a trapezoid. Thus, the pillars may be grouped into pillar groups each including pillars arranged such that bending deformation directions thereof are symmetric to one another.

FIG. 14(*a*) and FIG. 14(*a*) show a device transfer process using a non-rigid pad 100*a* including pillars 120 arranged at regular intervals. When the non-rigid pad 100*a* including pillars 120 arranged at regular intervals is used, at the moment when the pressing unit 40 starts rolling, pillars 120 at the front end E1 of the non-rigid pad 100*a* are compressed by pressing force of the pressing unit 40, causing the transfer film 30 and the target substrate 10 to be lifted at a rear end thereof (see FIG. 14(*a*)) and, at the moment when the pressing unit 40 finishes rolling, pillars 120 at the rear end E2 of the non-rigid pad 100*a* are compressed by pressing force of the pressing unit 40, causing the transfer film 30 and the target substrate 10 to be lifted at a front end thereof (see FIG. 14(*a'*)). Thus, the non-rigid pad 100*a* cannot perform desired functions.

Conversely, when a non-rigid pad 100 having a pillar density as shown in FIG. 13 is used, at the moment when the pressing unit 40 starts rolling, pillars 120 at the front end E1 of the non-rigid pad 100 are not compressed much and, at the moment when the pressing unit 40 finishes rolling, pillars 120 at the rear end E2 of the non-rigid pad 100 are not compressed much, thereby preventing the transfer film 30 and the target substrate 10 from being lifted at the front end or the rear end thereof. Thus, the non-rigid pad 100 can perform desired functions (see FIG. 14(*b*) and FIG. 14(*b'*)).

In some embodiments, the non-rigid pad for device transfer according to the present invention may be provided in the form of a stack of two non-rigid pads. Using the stack of two non-rigid pads is the equivalent to lengthening the pillar 120.

FIG. 15 shows another example of the first exemplary application of the non-rigid pad of FIG. 2 and a displacement/load graph thereof.

FIG. 15(*a*) shows a stack of two non-rigid pads 100*a*, 100*b*, wherein a relative position between a base plate 110*a* and a pillar 120*a* of one non-rigid pad 100*a* is identical to a relative position between a base plate 110*b* and a pillar 120*b* of the other non-rigid pad 100*b*. Referring to FIG. 15(*b*), it can be seen that the stack of FIG. 15(*a*) generates a first load F1 within a displacement range from a first displacement d1 to a second displacement d2.

FIG. 15(*a'*) shows a stack of two non-rigid pads 100*a*, 100*b*, wherein a relative position between a base plate 110*a* and a pillar 120*a* of one non-rigid pad 100*a* is opposite to a relative position between a base plate 110*b* and a pillar 120*b* of the other non-rigid pad 100*b*. Referring to FIG. 15(*b'*), it can be seen that the stack of FIG. 15(*a'*) generates a first load F1 within a displacement range from a first displacement d1 to a second displacement d2.

In addition, it can be seen that the first displacement d1, the second displacement d2, and the first load F1 in FIG. 15(*b'*) have almost the same values as the first displacement d1, the second displacement d2, and the first load F1 in FIG. 15(*b*). This result shows that the stacked form of the two non-rigid pads 100*a*, 100*b* has no significant influence on a displacement range in which a constant load is generated and the magnitude of the load.

FIG. 16 is a schematic view illustrating a second exemplary application of the non-rigid pad of FIG. 2. Since the second exemplary application is different from the first exemplary application in terms of the position of the non-rigid pad for device transfer, repeated description of the same features as those described above will be omitted.

Referring to FIG. 16, in this application, the non-rigid pad 100 may be disposed under a target substrate 10 to which multiple devices 20 adhesively attached to a transfer film 30 are to be transferred. When a pressing unit 40 provides pressing force to transfer the multiple devices 20 to the target substrate 10, the non-rigid pad 100 may be bent and deformed to allow uniform contact pressure to be applied between the multiple devices 20 and the target substrate 10.

This arrangement may be used when it is difficult to attach the non-rigid pad 100 to an outer circumferential surface of the pressing unit 40 due to a small diameter of the pressing unit 40 or when it is difficult to dispose the non-rigid pad 100 between the pressing unit 40 and the transfer film 30.

In this application, the non-rigid pad 100 may be disposed such that the base plate 110 closely contacts the target substrate 10 or the other end of the pillar 120 closely contacts the target substrate 10. In addition, the non-rigid pad 100 may be provided in the form of a stack of two non-rigid pads.

FIG. 17 is a schematic view illustrating a third exemplary application of the non-rigid pad of FIG. 2. In this application, the non-rigid pad may be disposed at the positions described in both of the first and second applications.

Referring to FIG. 17, in this application, two non-rigid pads may be disposed under the target substrate 10 and between the transfer film 30 and the pressing unit 40, respectively. Upon application of pressing force by the pressing unit 40, both the non-rigid pads may be bent and deformed to allow uniform contact pressure to be applied between the multiple devices 20 and the target substrate 10.

When the non-rigid pads 100a, 100b are identical to each other in terms of a displacement range in which a constant load is generated, the non-rigid pads 100a, 100b may be bent and deformed simultaneously upon application of pressing force by the pressing unit 40.

When the non-rigid pads 100a, 100b are different from each other in terms of a displacement range in which a constant load is generated, the non-rigid pads 100a, 100b may be bent and deformed sequentially upon application of pressing force by the pressing unit 40. For example, when the non-rigid pad 100a disposed under the target substrate 10 undergoes bending deformation in a relatively small displacement range, pillars 120a of the non-rigid pad 100a disposed under the target substrate 10 are bent and deformed first and then pillars 120b of the non-rigid pad 100b disposed between the pressing unit 40 and the transfer film 30 are bent and deformed. In this application, since each of the non-rigid pads 100a, 100b has a different zero-stiffness region, the range of the zero-stiffness region can be widened.

In this application, the non-rigid pads 100a, 100b may be opposite to each other in terms of the position of the base plate or the pillars. In addition, each of the non-rigid pads 100a, 100b may be provided in the form of a stack of two non-rigid pads.

FIG. 18 shows an exemplary application of a non-rigid pad group for device transfer and a displacement/load graph of the non-rigid pad group, wherein the non-rigid pad group is a group of non-rigid pads as shown in FIG. 2.

The non-rigid pad group may include multiple non-rigid pads. Although FIG. 18 shows a 4-layer non-rigid pad group including four non-rigid pads 100a, 100b, 100c, 100d, this is for illustration only and the non-rigid pad group may have a structure in which three or more non-rigid pads are stacked one above another.

Referring to FIG. 18, the non-rigid pads 100a, 100b, 100c, 100d of the non-rigid pad group may be arranged such that the positions of respective base plates 110a, 110b, 110c, 110d relative to respective pillars 120a, 120b, 120c, 120d are identical to one another. However, it should be understood that the present invention is not limited thereto and the non-rigid pads 100a, 100b, 100c, 100d of the non-rigid pad group may be arranged such that the positions of the base plates 110a, 110b, 110c, 110d relative to the pillars 120a, 120b, 120c, 120d are different from one another.

Upon application of external force to the non-rigid pad group, some of the multiple non-rigid pads are bent and deformed first to generate a first load F1 in a displacement range from a first displacement d1 to a second displacement d2. Then, upon application of increased external force to the non-rigid pad group, the other non-rigid pads are bent and deformed second to generate a third load F3 in a displacement range from a third displacement d3 to a fourth displacement d4.

As is well known in the art, as a constraint acting on both ends of the pillar decreases, a load generated by bending deformation of the pillar decreases and, as a constraint acting on both ends of the pillar increases, a load generated by bending deformation of the pillar load increases. The reason why the non-rigid pad group has multiple zero-stiffness regions where different loads are generated in different displacement ranges is because friction between a base plate of one non-rigid pad and a base plate (or pillars) of another non-rigid pad adjacent thereto may be different in different pairs of adjacent non-rigid pads, causing differences in constraint acting on the ends of the pillar and thus differences in load generated by bending deformation of the pillar.

The non-rigid pad group may be disposed between the transfer film and the pressing unit, may be disposed under the target substrate, or may be disposed both between the transfer film and the pressing unit and under the target substrate.

When the pressing unit applies pressing force to the non-rigid pad group disposed as above, some of the non-rigid pads are bent and deformed first to allow uniform contact pressure having a first value to be applied between the devices and the target substrate. Then, upon application of increased pressing force by the pressing unit, the other non-rigid pads are bent and deformed second to allow uniform contact pressure having a second value greater than the first value to be applied between the devices and the target substrate. In this way, it is possible to selectively transfer some of the multiple devices to the target substrate.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. For example, components described as implemented separately may also be implemented in combined form, and vice versa.

The scope of the present invention is indicated by the following claims and all changes or modifications derived from the meaning and scope of the claims and equivalents thereto should be construed as being within the scope of the present invention.

The invention claimed is:

1. A non-rigid pad for device transfer, comprising:

a base plate; and multiple pillars each protruding from one surface of the base plate with one end thereof connected to the one surface of the base plate, the pillars being bent and deformed upon application of external force, wherein the non-rigid pad is disposed at at least one location selected from among a location between a transfer film to which multiple devices to be transferred to a target substrate are adhesively attached and a pressing unit providing pressing force to transfer the multiple devices to the target substrate and a location under the target substrate, the non-rigid pad being bent and deformed upon application of pressing force by the pressing unit to allow uniform contact pressure to be applied between the multiple devices and the target substrate, wherein the pillars are grouped into pillar groups, and pillars belonging to each pillar group are arranged such that bending deformation directions thereof are symmetric to one another.

2. The non-rigid pad according to claim 1, wherein the base plate contacts the transfer film and the other end of each of the pillars is disposed to face the pressing unit.

3. The non-rigid pad according to claim 1, wherein the other end of each of the pillars contacts the transfer film and the base plate is disposed to face the pressing unit.

4. The non-rigid pad according to claim 1, wherein the base plate contacts the target substrate.

5. The non-rigid pad according to claim 1, wherein the other end of each of the pillars contacts the target substrate.

6. The non-rigid pad according to claim 1, wherein the base plate and the pillars are formed of at least one selected from among silicone rubber, urethane rubber, fluororubber, ethylene-propylene-diene rubber (EPDM), nitrile-butadiene rubber (NBR), and poly(methyl methacrylate)(PMMA).

7. The non-rigid pad according to claim 1, wherein each of the pillars has an asymmetrical cross-sectional shape to control a bending deformation direction of the pillar.

8. A non-rigid pad for device transfer, comprising:
a base plate; and
multiple pillars each protruding from one surface of the base plate with one end thereof connected to the one surface of the base plate, the pillars being bent and deformed upon application of external force, wherein the non-rigid pad is disposed at at least one location selected from among a location between a transfer film to which multiple devices to be transferred to a target substrate are adhesively attached and a pressing unit providing pressing force to transfer the multiple devices to the target substrate and a location under the target substrate, the non-rigid pad being bent and deformed upon application of pressing force by the pressing unit to allow uniform contact pressure to be applied between the multiple devices and the target substrate, wherein the pressing unit is a roller, and density of the pillars increases from a center of the base plate toward a front end and a rear end of the base plate with respect to a moving direction of the pressing unit.

9. A non-rigid pad for device transfer, comprising:
a base plate; and
multiple pillars each protruding from one surface of the base plate with one end thereof connected to the one surface of the base plate, the pillars being bent and deformed upon application of external force, wherein the non-rigid pad is disposed at at least one location selected from among a location between a transfer film to which multiple devices to be transferred to a target substrate are adhesively attached and a pressing unit providing pressing force to transfer the multiple devices to the target substrate and a location under the target substrate, the non-rigid pad being bent and deformed upon application of pressing force by the pressing unit to allow uniform contact pressure to be applied between the multiple devices and the target substrate, wherein each of the pillars has a shape bent in one direction to be eccentric in an initial state thereof, and is bent and deformed in the initial bending direction thereof upon application of external force.

10. The non-rigid pad according to claim 9, wherein each of the pillars has a first straight portion axially extending from one end of the pillar, a bent portion connected at one end thereof to the first straight portion and bent in one direction to be eccentric, and a second straight portion axially extending from the other end of the bent portion.

11. The non-rigid pad according to claim 9, wherein each of the pillars has a first portion extending obliquely in one direction from one end of the pillar and a second portion connected at one end thereof to the first portion and obliquely extending in an opposite direction with respect to the extension direction of the first portion.

12. The non-rigid pad according to claim 11, wherein the other end of the second extension portion is rounded.

13. A non-rigid pad group for device transfer, comprising:
a stack of at least three non-rigid pads for device transfer each comprising a base plate and multiple pillars each protruding from one surface of the base plate with one end thereof connected to the one surface of the base plate, the pillars being bent and deformed upon application of external force, wherein the non-rigid pad group is disposed between a transfer film to which multiple devices to be transferred to a target substrate are adhesively attached and a pressing unit providing pressing force to transfer the multiple devices to the target substrate, the non-rigid pad group is primarily bent and deformed upon application of pressing force by the pressing unit to allow uniform contact pressure having a first value to be applied between the multiple devices and the target substrate, and the non-rigid pad group is secondarily bent and deformed upon application of increased pressing force by the pressing unit to allow uniform contact pressure having a second value greater than the first value to be applied between the multiple devices and the target substrate.

14. A non-rigid pad group for device transfer, comprising:
a stack of at least three non-rigid pads for device transfer each comprising a base plate and multiple pillars each protruding from one surface of the base plate with one end thereof connected to the one surface of the base plate, the pillars being bent and deformed upon application of external force, wherein the non-rigid pad group is disposed under a target substrate to which multiple devices adhesively attached to a transfer film are to be transferred by pressing force applied by a pressing unit, the non-rigid pad group is primarily bent and deformed upon application of pressing force by the pressing unit to allow uniform contact pressure having a first value to be applied between the multiple devices and the target substrate, and the non-rigid pad group is secondarily bent and deformed upon application of increased pressing force by the pressing unit to allow uniform contact pressure having a second value greater than the first value to be applied between the multiple devices and the target substrate.

* * * * *